United States Patent
Hennig

(10) Patent No.: US 6,320,381 B1
(45) Date of Patent: Nov. 20, 2001

(54) MEASURING METHOD OF SPATIALLY RESOLVED MAGNETIC RESONANCE SPECTROSCOPY

(75) Inventor: Juergen Hennig, Freiburg (DE)

(73) Assignee: Klinikum der Albert-Ludwigs-Universität Freiburg, Freiburg (DE)

( * ) Notice: Subject to any disclaimer, the term of this patent is extended or adjusted under 35 U.S.C. 154(b) by 0 days.

(21) Appl. No.: 09/465,704

(22) Filed: Dec. 17, 1999

(30) Foreign Application Priority Data

Jan. 9, 1999 (DE) .............................. 199 00 578

(51) Int. Cl.$^7$ ...................................... G01V 3/00
(52) U.S. Cl. ........................ 324/312; 324/307; 324/309
(58) Field of Search ................................... 324/300–322; 600/410

(56) References Cited

U.S. PATENT DOCUMENTS

| | | | |
|---|---|---|---|
| H1218 * | 8/1993 | Cory et al. ........................... | 324/309 |
| 4,646,023 | 2/1987 | Young . | |
| 5,627,469 | 5/1997 | Hong et al. . | |
| 5,879,299 * | 3/1999 | Posse et al. .......................... | 600/410 |

FOREIGN PATENT DOCUMENTS 0 429 295    5/1991  (EP) .

OTHER PUBLICATIONS

NMR in Biomedicine; vol. 5, pp. 238–243, 1992 Truman R. Brown "Practical Application of Chemical Shift Imaging".
Magnetic Resonance in Medicine 14, pp. 26–30, 1990 Uwe Klose "In Vivo Proton Spectroscopy in Presence of Eddy Currents".
Functional Imaging, 1998 "Radio Waves:Magnetic Resonance", Juergen Hennig Chapter 8 pp. 261–390.
Magnetic Resonance in Medicine 8, pp. 314–322, 1988 Xiaoping Hu et al. "SLIM: Spectral Localization by Imaging".
"Spectral Localization with Optimal Pointspread Function", Markus von Kienlin and Raymond Mejia, 1990/1991.
"In Vivo Measurement of Regional Brain Metabolic . . . ", Stefan Posse et al., 1997, pp. 858–865.
"Magnetic resonance tomography of joint abnormalities; the use of chemical shift imaging", H. Koenig et al, pp. 43–48.
Magnetic Resonance in Medicine 25, pp. 289–298, 1992, J. Hennig "Chemical Shift Imaging with Phase–Encoding RF Pulses".
Magnetic Resonance in Medicine 25, pp. 349–354 (1992), "Hadamard Spectroscopic Imaging Technique as Applied to Study Human Calf Muscles", Gadi Goelman et al.

* cited by examiner

Primary Examiner—Jay Patidar
Assistant Examiner—Tiffany A. Fetzner
(74) Attorney, Agent, or Firm—Paul Vincent

(57) ABSTRACT

A method of spatially resolved magnetic resonance spectroscopy according to the principle of chemical shift imaging (=CSI) in which, through application of an excitation pulse, spins in a measuring volume are excited and a metabolite signal thereof is read out, wherein between the excitation pulse and the recording of the signal, spatial encoding of the signal is effected by means of a gradient pulse in at least one spatial direction, wherein said spatial encoding gradient is varied between each recording step, such that one obtains spatial allocation of the recorded signals in the partial volume of the measuring volume, is characterized in that a reference signal is recorded in addition to the signal of the recorded metabolites, which comprises the same spatial encoding as the metabolite signal, wherein the recording of the two signals is effected in a convoluted manner. This method enables the correction of the local effects without considerable increase of the recording time in order to obtain in this manner standardized and comparable results independently of occurring imperfections during the recording.

20 Claims, 2 Drawing Sheets

MEASURING METHOD OF SPATIALLY RESOLVED MAGNETIC RESONANCE SPECTROSCOPY

Figure 1:
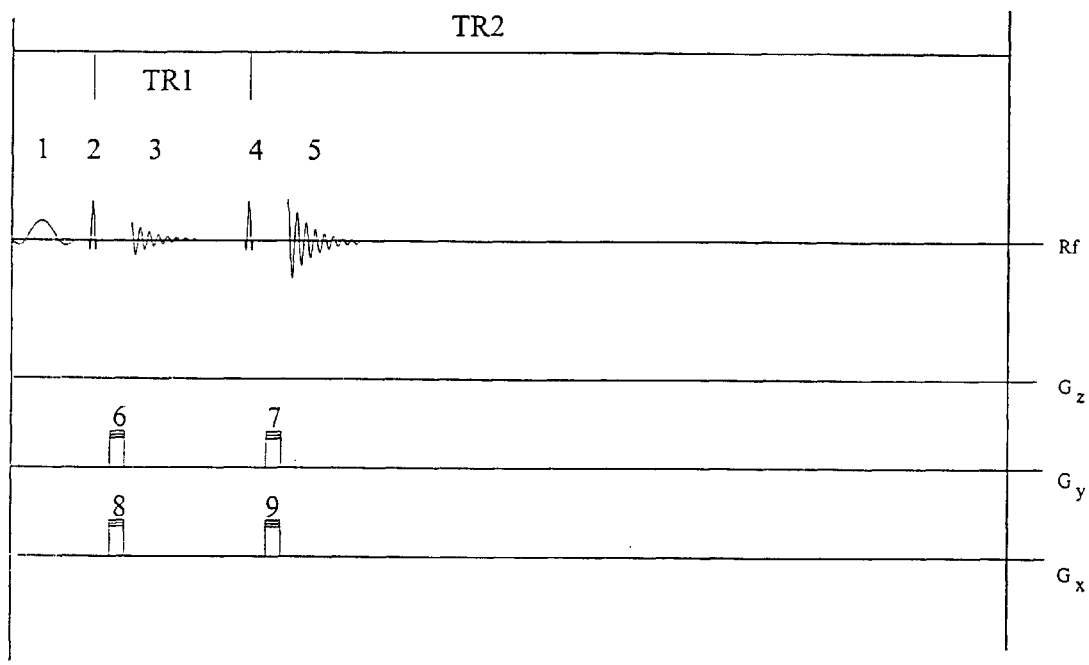

This application claims Paris convention priority of German patent application 199 00 578.8 filed Jan. 9, 1999, the complete disclosure of which is hereby incorporated by reference.

BACKGROUND OF THE INVENTION

The invention relates to a method of spatially resolved magnetic resonance spetroscopy according to the principle of chemical shift imaging (=CSI), wherein through application of an excitation pulse, spins in a measuring volume are excited and a metabolite signal thereof is read out, wherein between excitation pulse and acquisition of the signal, spatial encoding of the signal by means of a gradient pulse is effected in at least one spatial direction, wherein said spatial encoding gradient is varied successively from one recording step to the other, such that spatial allocation of the recorded signals in partial volumes of the measuring volume is obtained.

A method of this type is e.g. known from Brown, T R, NMR in Biomedicine 5, 238–243, 1992.

The spatially resolved magnetic resonance spectroscopy by means of so-called chemical-shift imaging (CSI) allows determination of the distribution of metabolites in materials, organisms, animals and humans. One problem in this connection is the optimization of the recorded signals with respect to further evaluation. The regional differences between relevant parameters like field homogeneity, susceptibility etc. result in corresponding significant differences in the recorded individual signals which complicate further evaluation of the signals etc., e.g. for representing the distributions of metabolites and quantifications of the signals, and considerably impede the application, mainly on the patient.

SUMMARY OF THE INVENTION

Therefore, it is an object of the method according to the invention to present a technique which allows correction of the local effects without essentially prolonging the acquisition time in order to achieve in this manner standardized and comparable results independently of occurring imperfections during the recording.

Magnetic resonance spectroscopy (MRS) is an examination method which has already been admitted in some countries to be used in clinical applications on patients, which enables important conclusions about pathological changes of metabolites. In particular, proton spectroscopy of a head and phosphorus-spectroscopic observation of the energy metabolism in muscles and other organs, have already met a wide range of application. In most cases, the recording of data is effected in so-called single-voxel technology, in which a spectrum is recorded in one single defined area of the body in each case. Methods of recording spatially distributed MR spectra are also known. The techniques most frequently used in this connection utilize the principle of the above-mentioned chemical-shift imaging (CSI), in which spatial encoding of the spatial signals (if required from a pre-determined limited range) is effected through corresponding so-called phase encoding gradients. Such technologies can be easily realized with respect to the technical side of the measurement, however, they require relatively long measuring times $T_{AQ}$, which are defined by $$T_{AQ} = n \cdot m \cdot t_r \cdot n_{aq} \quad (1),$$

wherein
n and m represent the size of the spatial recording matrix, $t_r$ the repeating time between two recording steps and $n_{aq}$ the number of averaging for each recording step.

Since $t_r$ is, in almost all practical fields of application of CSI, in the range of between 1 and 3 seconds, due to the long $T_1$ relaxation periods of metabolites, it is possible even with moderate spatial resolution of 16×16 spectra, to obtain an acquisition time in the range of several minutes up to half an hour and more.

One problem in the post-processing of the spectra consists in that the spectra from different areas, obtained in this manner, cannot be compared directly due to the different local conditions like field inhomogeneity and susceptibility effects etc. The spatially different resonance frequencies, caused by field inhomogeneity and susceptibility effects do not only lead to a shift of the signals of the individual metabolites which must be corrected for creating the metabolite distributions.

Moreover, proton MRS leads to a local change of the efficiency of suppressing the undesired water signal which appears in a base line which is different for each spectrum and causes considerable disturbances. Additionally, these local changes of the magnetic field cause different line shapes of the individual signals which prevent calculation of the metabolite concentration from the spectra, at least by means of simple algorithms like amplitude measurement, integration etc.

Furthermore, even measurements carried out with the most modern gradient generation systems show different line shapes, depending on the location, due to the gradient-based eddy currents which can be corrected only partly even with complicated post-processing routines.

For recording individual spectra with single-voxel techniques, it is possible to eliminate all these imperfections by recording a reference signal. (See Klose U., Magnetic Resonance in Medicine 14, 26–30 1989). The data acquisition in this connection is carried out under otherwise identical conditions, however, without the suppression of water. Since the local effects influence the water signal in the same manner as metabolite signals, one can furthermore calculate a standardized spectrum through deconvolution of the metabolite signals with the reference signal. Due to the high intensity of the water signal, this reference signal can be achieved for individual voxel measurements in a few recording steps and thus within a measuring time of a few seconds.

Transfer of this method to CSI is principally possible, however, its practical application failed up to now due to the considerably increased acquisition time. Equation (1) also applies to the entire recording time of the reference signal irrespective of the intensity of the water resonance. The measuring time of a CSI experiment, which is long anyway, would thus additionally and considerably be increased even for choosing $n_{aq}=1$.

For reducing this problem, various measures leading to a reduction of the acquisition of the reference data set are discussed in literature. These measures include, on the one hand, considerable reduction of $t_r$ for the reference recording, and on the other hand reduction of n and m and thus of the recording matrix of the reference signal. Both measures still include a significant increase of the total measuring time.

Due to the fact that the reference recording was not carried out under the same recording conditions as the actual CSI recording, the correction will be imperfect in addition. The method of recording the reference signal with short repeating period has furthermore the disadvantage that in this case, if $t_r$ is shorter than the relaxation time T2 of the water, so-called steady-state signals are generated which can alter the useful signal in such a manner that it is no longer suitable as reference signal. For these reasons, these methods did not gain acceptance in practice up to now.

The method according to the invention includes integration of the recording of the reference signal into the actual CSI recording. In this connection, the recording of the reference signal is carried out in a manner convoluted with the recording of the metabolite signals.

DESCRIPTION OF THE PREFERRED EMBODIMENT

The principle of the method is shown in FIG. 1 by means of a typical CSI method in which spatial encoding of the recorded signals is effected through the gradients Gx and Gy in the x,y plane. Therein, 1 represents a water suppression pulse, 2 the excitation pulse of the acquisition of the spatially encoded metabolite signals 3. 4 is the excitation pulse for the reference signal 5. 6 and 7 as well as 8, 9 correspond to the phase encoding gradients of metabolite and reference signal, respectively, in the x,y plane.

The acquisition of the reference signal is carried out after a time TR1 which is very short as compared with the repeating time of the entire acquisition cycle TR2 such that there is no essential increase in the total measuring time. Due to the short TR1 (typically between 500 and 300 ms) the signal of the water line as reference is considerably weakened by saturation, however, because of the intrinsically extremely high intensity it is still more than sufficient for obtaining the signals associated with the respective individual volumes after corresponding two-dimensional Fourier transformation. The signals of the individual voxels obtained in this manner can thus be compared directly, and be guided to be further interpreted.

The method described can be easily transferred to modifications of the CSI method. In particular, convoluted recording can be realized also for CSI recording methods in which, in addition to spatial encoding, the volume to be examined is excited through application of at least one excitation pulse in the presence of a slice selection gradient, such that the volume to be examined is limited to the partial volume defined by said slice selection. In this manner, CSI techniques with spatial selection in all three spatial directions are normally carried out according to the principle of the PRESS or STEAM method limited to a rectangular partial volume (J. Hennig in Functional Imaging, Lippincott, 376ff, 1996).

The spatial dimension of the spatial encoding may be 1, 2 or 3-dimensional through corresponding selection of the phase encoding gradient. Also techniques which allow spatial allocation of the spectra to non-isotropic voxels, like e.g. Slim (Hu, X., Magn.Res. in Med. 8,314,1988) and Sloop (von Kienlin M., 3. Magn. Reson. 94, 268, 1991) can be modified in the described manner.

Finally, the principle of the method may also be applied to techniques which utilize encoding techniques other than spatial encoding according to the principle of Fourier encoding, like e.g. Hadamard encoding or Wavelet encoding.

Figure 2:
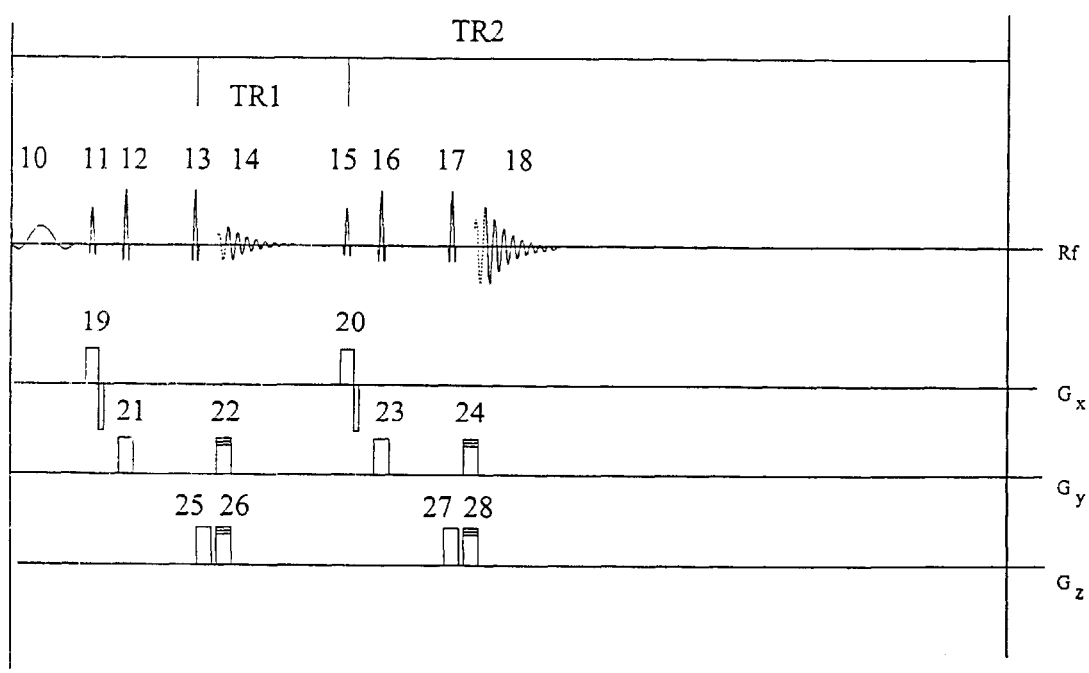

FIG. 2 shows this in an exemplary manner by means of a PRESS experiment with two-dimensional spatial encoding in a volume defined by three slice selection pulses. Therein:
10: water suppression pulse,
11,12 and 13: 90°, 180°, 180° pulses of the PRESS excitation sequence for the metabolite signal,
14: metabolite signal,
15,16 and 17: 90°, 180°, 180° pulse of the PRESS excitation sequence for the reference signal,
18: Reference signal,
19,20,21,23,25,27: Slice selection gradients,
22,24,26,28: spatial encoding gradients.

The implementations of the principle of the convoluted recording of the reference signal described up to now concerned recording techniques in which a spectral signal is acquired in each recording step and the spatial encoding is varied from one recording step to the next. In general, the principle can also be applied to such methods in which several spatial encoding steps are used in each recording step.

In this manner, it is possible to render the method of the echo planner spectroscopic imaging (EPSI) or PROTON ECHO PLANER SPECTROSCOPIC IMAGING (PEPSI) (Posse S. et. al. Magn Res. in Medicine 37,858, 1997) more efficient in the described manner with convoluted reference recording. With the EPSI method the read-out of the signal is effected under a quickly and multiply inverted gradient which leads to spatial encoding in one direction. Moreover, it is possible to encode also several spatial dimensions by means of further phase encoding gradients in one or two additional spatial directions, wherein the recording of the entire data set is effected with N spatial and one spectroscopic dimension in several excitation steps.

Figure 3:
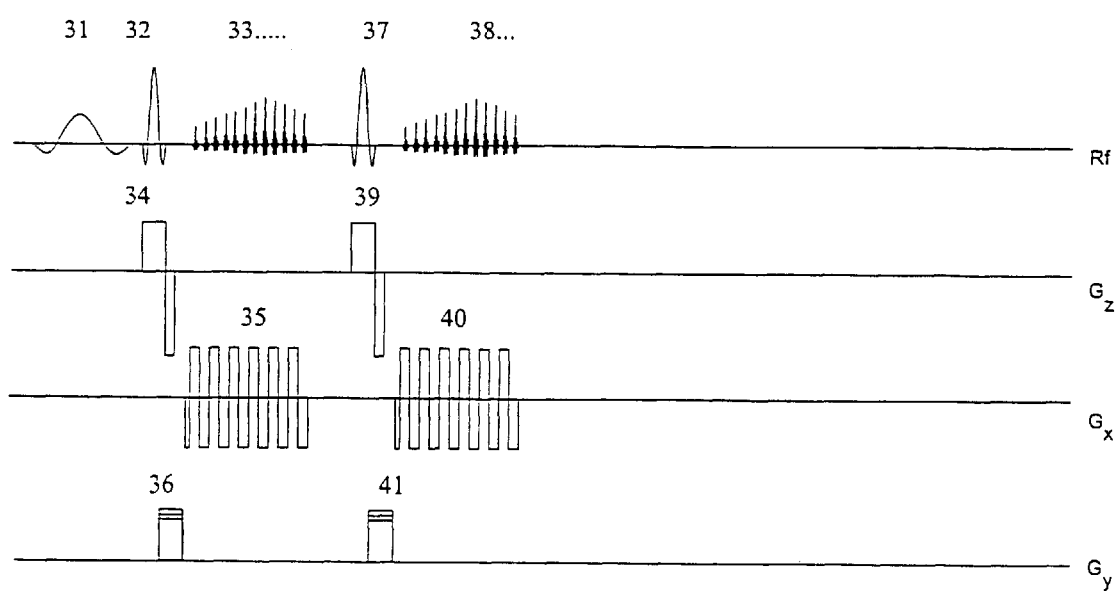

FIG. 3 thus shows a typical implementation of such a method according to EPSI. Therein:
31: Water suppression pulse,
32: Excitation pulse for the metabolite signal,
33: Metabolite signals,
37: Excitation pulse for the reference signal,
38: Reference signals,
34, 39: Slice selection gradients,
35, 40: Space encoding gradients in the x direction which lead to multiple formation of the signals 33 . . . and 38 . . . through fast and repeated inversion,
36, 41: Phase encoding gradient in the y direction which is varied after each recording step.

Other implementations for encoding the spatial information to the signal as well as measures for optimizing the signal with EPSI are known per se by the expert and can be easily applied to the method according to the invention.

I claim:
1. Method of spatially resolved magnetic resonance spectroscopy according to the principle of chemical shift imaging (=CSI), wherein through application of an excitation pulse, spins in a measuring volume are excited and a metabolite signal thereof is read out, wherein between excitation pulse and acquisition of the signal, spatial encoding of the signal by means of a gradient pulse in at least one spatial direction is carried out, wherein said spatial encoding gradient is varied successively between the recording steps such that one obtains spatial allocation of the recorded signals in partial volumes of the measuring volume, characterized in that
during the reception of the signal of the metabolites, a reference signal is recorded in an alternating manner which comprises the same spatial encoding as the metabolite signal, wherein the acquisition of the two signals is performed in a convoluted manner.

2. Method according to claim 1, characterized in that spatial encoding is effected through the use of spatial encoding gradients according to the principle of N-dimensional phase encoding.

3. Method according to claim 1, characterized in that anisotropic spatial encoding is effected through corresponding numerically optimized phase encoding gradients.

4. Method according to claim 3, characterized in that spatial encoding is effected through the use of spatial encoding gradients according to the principle of N-dimensional phase encoding.

5. Method according to claim 1, characterized in that spatial encoding is effected according to the principle of Hadamard encoding.

6. Method according to claim 1, characterized in that, in addition to the spatial encoding of the signals, the measuring volume is limited to one slice through application of a slice selection gradient during the excitation pulse.

7. Method according to claim 6, characterized in that that spatial encoding is effected through the use of spatial encoding gradients according to the principle of N-dimensional phase encoding.

8. Method according to claim 6, characterized in that anisotropic spatial encoding is effected through corresponding numerically optimized phase encoding gradients.

9. Method according to claim 6, characterized in that spatial encoding is effected according to the principle of Hadamard encoding.

10. Method according to claim 1, characterized in that signal generation is effected through combination of several radio frequency pulses as spin echo or stimulated echo, wherein further limitation of the measuring volume is effected through application of slice selection gradients during at least one radio frequency pulse used in the excitation sequence.

11. Method according to claim 10, characterized in that spatial encoding is effected through the use of spatial encoding gradients according to the principle of N-dimensional phase encoding.

12. Method according to claim 10, characterized in that anisotropic spatial encoding is effected through corresponding numerically optimized phase encoding gradients.

13. Method according to claim 10, characterized in that spatial encoding is effected according to the principle of Hadamard encoding.

14. Method according to claim 10, characterized in that, in addition to the spatial encoding of the signals, the measuring volume is limited to one slice through application of a slice selection gradient during the excitation pulse.

15. Method according to claim 1, characterized in that the generation of signals is carried out through repeated inversion of a gradient according to the principle of the EPSI method.

16. Method according to claim 15, characterized in that, in addition to the spatial encoding of the signals, the measuring volume is limited to one slice through application of a slice selection gradient during the excitation pulse.

17. Method according to claim 15, characterized in that signal generation is effected through combination of several radio frequency pulses as spin echo or stimulated echo, wherein further limitation of the measuring volume is effected through application of slice selection gradients during at least one radio frequency pulse used in the excitation sequence.

18. Method according to claim 17, characterized in that, in addition to the spatial encoding of the signals, the measuring volume is limited to one slice through application of a slice selection gradient during the excitation pulse.

19. Method according to claim 18, characterized in that spatial encoding is effected through the use of spatial encoding gradients according to the principle of N-dimensional phase encoding.

20. Method according to claim 19, characterized in that anisotropic spatial encoding is effected through corresponding numerically optimized phase encoding gradients.

* * * * *